United States Patent [19]

Guretzky

[11] 4,410,852
[45] Oct. 18, 1983

[54] ANGLE-POSITION TRANSDUCER

[76] Inventor: Harold Guretzky, 95-15 108 St., Richmond Hill, N.Y. 11419

[21] Appl. No.: 330,170

[22] Filed: Dec. 14, 1981

Related U.S. Application Data

[63] Continuation-in-part of Ser. No. 180,335, Aug. 22, 1980, Pat. No. 4,320,293, which is a continuation of Ser. No. 934,680, Aug. 30, 1978, abandoned.

[51] Int. Cl.³ .................... G01R 27/26; G05B 1/06
[52] U.S. Cl. ........................ 324/61 P; 340/870.37; 318/662
[58] Field of Search ............. 340/870.37; 324/61 QS, 324/61 R, 61 P; 318/662

[56] References Cited

U.S. PATENT DOCUMENTS

| 2,473,401 | 6/1949 | Wild | 318/662 X |
| 3,080,513 | 3/1963 | Edwards | 318/662 |
| 3,340,536 | 9/1967 | Sauber | 318/662 X |
| 3,860,918 | 1/1975 | Cencel | 340/870.37 |
| 4,177,421 | 12/1979 | Thornburg | 340/870.37 X |
| 4,2338,781 | 12/1980 | Vercellotti | 340/870.37 |

OTHER PUBLICATIONS

Hardway: "Position Sensor ... Accuracy and Reliability" Electronics–Aug. 16, 1971–p. 86.
Hoernes: "Scale for a Positioning Table" IBM Bulletin–vol. 7–No. 10—Mar. 1965–p. 913.
Foldvari: "Capacitive Transducers"—Instruments and Control Systems—Nov. 1964—p. 77.

Primary Examiner—Stanley T. Krawczewicz
Assistant Examiner—Jose M. Solis
Attorney, Agent, or Firm—Howard Alan Taishoff

[57] ABSTRACT

Angle-position is determined by relative angular rotation between a capacitive track and a capacitive pick-up probe. The capacitive track is disposed along the region of angular interest. The pick-up probe is oriented broadside to the capacitive track and closely spaced therefrom thus establishing a measurable capacity thereacross. As the capacitive track moves angularly relatively to the pick-up probe, a geometric asymmetry is produced therebetween causing the capacity that exists thereacross to change unambiguously and in a manner that exhibits analog correspondence with relative angular rotation.

18 Claims, 9 Drawing Figures

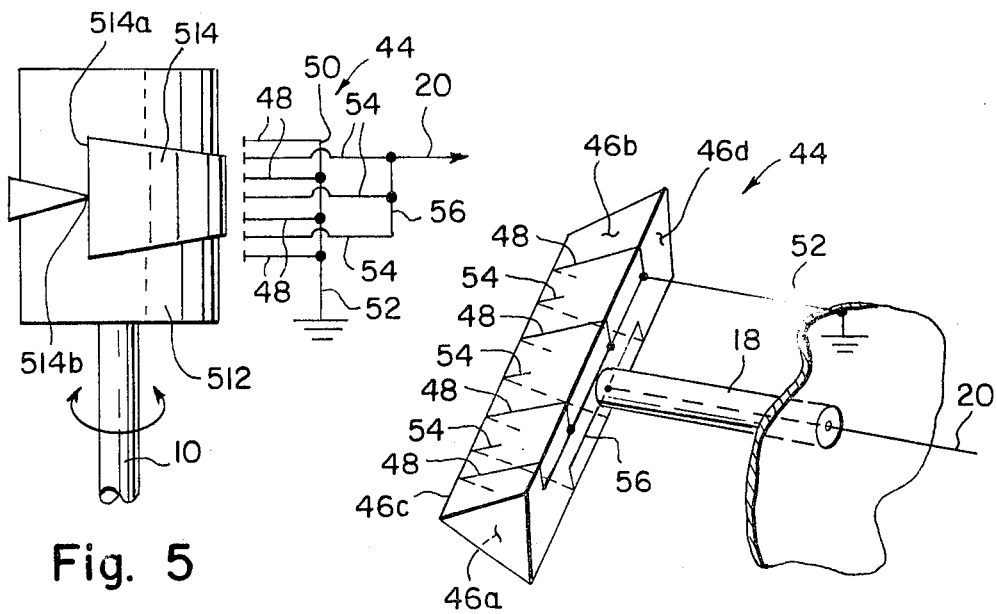
Fig. 5
Fig. 6
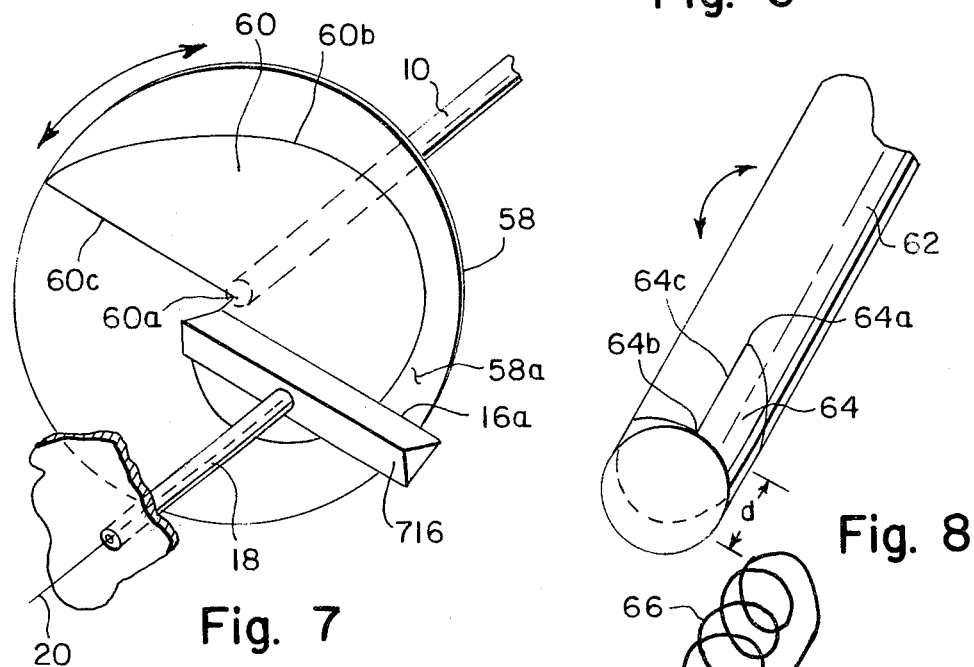
Fig. 7
Fig. 8

ANGLE-POSITION TRANSDUCER

This invention is a continuation-in-part of copending application Ser. No. 06/180,335, filed Aug. 22, 1980, now U.S. Pat. No. 4,320,293. Application Ser. No. 06/180,335 is a continuation of application Ser. No. 934,680, filed Aug. 30, 1978, now abandoned.

The present invention relates to an angle-position transducer, and more particularly, to an angle-position transducer using capacitance as the parameter that analogically relates to relative rotation.

The above-mentioned copending application discloses an angle-position transducer that uses light interrogation. In this light interrogated measuring system, a beam of light of constant intensity is formed into a narrow line-pattern and fired at an optical track. The angular position which is measured is determined by the relative angular displacement between the optical track and line-pattern. The optical track is in the form of a continuous single geometric figure, say, a triangle, which is coextensive with the region of angular interest. A detector, responsive to the energy of the light, is spaced from the optical track and is aligned with respect thereto so as to intercept the line-pattern after it impinges on the optical track. The geometry of the optical track interacts with the line-pattern unambiguously and causes the amount of light which is sent to the detector to exhibit correspondence with relative angular displacement.

There are many advantages that accrue from such a system. For one thing, angular displacement can be measured with hyperfine precision. For another, there is no sensible interraction between measuring apparatus and system being measured. Yet the above-described invention uses a simple principle and from this principle other construction readily suggest themselves. The present invention carries forward one of the constructions mentioned in the copending application.

In general, the present invention comprises a capacitive track which is coextensive with the region of angular interest. This capacitive track comprises one "plate" of a capacitor and is of triangular configuration, preferably. A capacitive pick-up probe or detector, preferably in the form of a knife edge, is spaced from the capacitive track and oriented broadside thereto. The knife edge comprises the other "plate" of the capacitor. The positioning of the knife edge with respect to the capacitive track is such as to establish a measurable capacity therebetween. As the one "plate" moves angularly relative to the other, or more to the point, as the capacitive track moves angularly relative to the pick-up probe, the capacity that exists therebetween changes. This analog change is capacity corresponds to relative angular rotation and is easily monitored by making the "capacitor" the frequency determining element of a free-running oscillator. Through a further novel mixing or hetrodyning arrangement, angular information becomes available as a frequency that corresponds with angular rotation directly.

It is therefore an object of the present invention to provide an angle-position transducer that utilizes the capacitance that exists between a uniquely configured capacitive track and a capacitive pick-up probe as the former and latter move angularly with respect to each other.

It is another object of the present invention to provide an angle-position transducer that causes minimal disturbance to the inertial balance of the system being measured, and which is readily adaptable to a variety of such systems.

It is a further object of the present invention to provide an angle-position transducer wherein the capacity between a capacitive track and a capacitive pick-up probe, as the one moves angularly relative to the other, exhibits unambiguous correspondence between such angular movement and is a functional analog thereof.

It is another object of the present invention to provide an angle-position transducer wherein a rotational change between the system being measured and the measuring apparatus effects a geometric asymmetry that produces a capacitive change which is proportional to such asymmetry.

Other objects and features of the present invention will become apparent from the following detailed description considered in connection with the accompanying drawings. It is to be understood, however, that the drawings are designed for purposes of illustration only and not as a definition of the limits of the invention for which reference should be made to the appending claims.

In the drawings, wherein the same reference numeral denotes the same element throughout the several views:

FIG. 5 is a diagrammatic illustration of a modified form of the inventive apparatus wherein the capacitive pick-up probe does not require a common electrical connection between itself and the capacitive track;

FIG. 6 is an enlarged perspective view of the pick-up probe of FIG. 5 revealing its structure in detail;

FIG. 7 is a diagrammatic perspective illustration of another embodiment of the present invention; and, FIG. 8 is a diagrammatic perspective illustration of a further embodiment of the present invention wherein relative angular rotation between system being measured and measuring apparatus produces a change in inductance.

Figure 1:
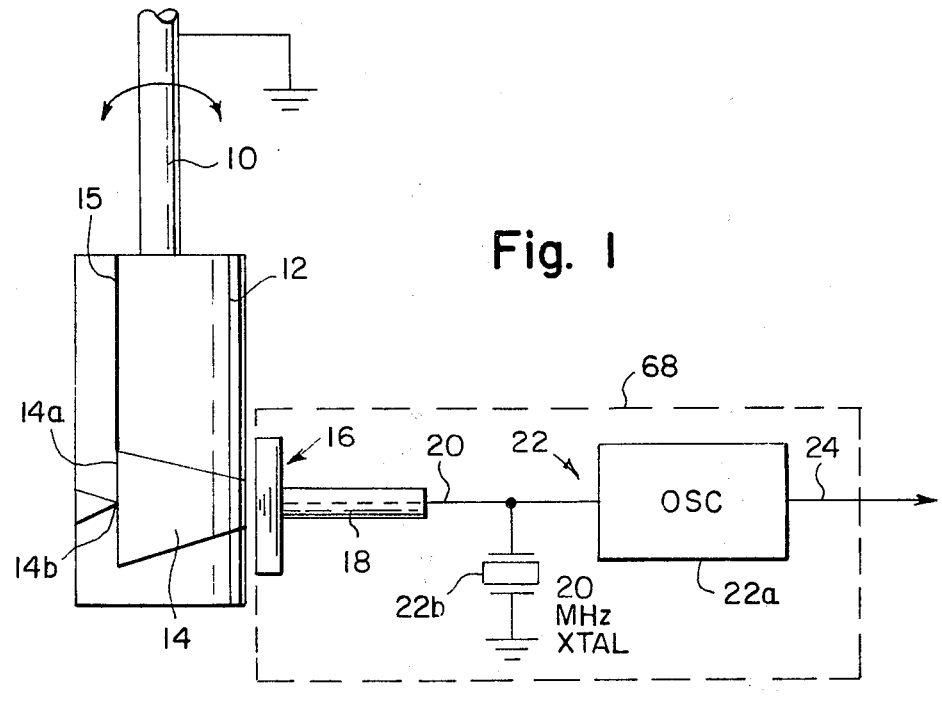
FIG. 1 is a diagrammatic illustration of the inventive apparatus applied to a shaft for determining the relative angular rotation thereof.

In detail now and referring to the drawings, FIGS. 1 through 4 show one embodiment of the present invention used to indicate the angular displacement of a shaft 10. Shaft 10 is formed with an enlarged cylindrical part 12 coaxially attached to the shaft for rotation therewith. Cylindrical or annular part 12 is comprised of dielectric stock and as such is electrically nonconducting. A capacitive track 14 is disposed along or subtends the circumference of cylindrical part 12, or, put another way, the track is coextensive with the region of angular interest. Capacitive track 14 is formed of a material that can act as one "plate" of a capacitor, and, as such, track 14 is preferably formed of metallic stock such as brass or silver foil, or some such material. There are many other ways of placing or forming a conductive track, such as track 14, on dielectric stock. Vacuum deposition is one way, photo-etching is another. A conductive lead 15 places track 14 at ground or at a common potential through shaft 10 as shown.

Figure 2A:
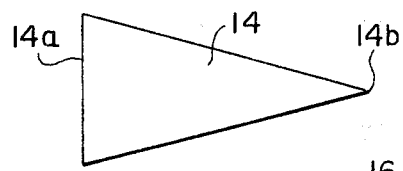
FIGS. 2a and 2b show two forms of a capacitive track according to the present invention, for purpose of clarity each track is laid out, so to speak, to reveal its geometric configuration.

In the embodiment being discussed, and now reference is made to FIG. 2A, the capacitive track is in the form of a triangle, and more particularly, track 14 is in the form of an isosceles triangle having a base 14a and a vertex or apex 14b. Base 14a is aligned parallel to the longitudinal axis of part 12. The height or altitude of the track is made equal to and thus is coextensive with the region of angular interest or, in this case, made equal to the circumferential periphery of part 12. With this geometry, vertex 14b meets base 14a at a point thereby defining a abrupt discontinuity of cross-section, seen clearly in FIG. 1.

A relatively stationary, elongate capacitive pick-up probe 16 is placed close to the annular periphery of track 14. Pick-up probe 16 acts as the other "plate" of the capacitor. More specifically, probe 16 is in the form of a metallic elongate wedge-like structure having a longitudinal length at least as long or as wide as base 14a. Probe 16 is formed with a sharp lengthwise straight edge 16a that is placed in broadside parallel opposition to the track. Pick-up probe 16 is supported by means of a dielectric arm 18 extending rearwardly therefrom, as shown. An electrical lead 20 is, on one end, electrically coupled to probe 16. The other end of lead 20 extends through arm 18 and thus the lead is immobilized from moving relative to pick-up probe 16. Probe 16 is positioned with respect to track 14 so as to be closely spaced therefrom with edge 16a essentially tangential to and facing cylindrical part 12 whereby the longitudinal axis of edge 16a is aligned parallel to longitudinal axis of part 12. Stated differently, straight edge 16a is pointed directly at track 14 with the longitudinal axis of the former placed orthogonal to the altitude or height of the latter and with such proximity as to establish a sensible capacity therebetween.

The other end of lead 20 is electrically coupled to the frequency determining element of an oscillator 22 comprised of a self-excited oscillator 22a and a 20 MHz frequency determining crystal 22b. The output of oscillator 22 is applied to appropriate signal processing apparatus, discussed below, for resultant digital display of relative angular rotation.

During use and operation of the invention as will be described below, the capacity that exists between track 14 and probe 16 is applied to the frequency determining element of oscillator 22 warping or pulling the frequency of same in analog correspondence with the relative angular rotation between the track and probe.

In the embodiment of FIGS. 1 through 4, a crystal, crystal 22b, is the frequency determining element of the oscillator. Electrically, and as a approximation, the crystal and its holder represent a series resonant circuit of high L and low C, shunted by the capacitance of the holder. The crystal can operate essentially as a parallel tuned circuit or a series tuned circuit depending on the mode of operation. In either case the capacity that is established between the track and probe is applied to the equivalent LC circuit of the crystal and is adapted to shift the resonant frequency of same in analog correspondence with relative angular rotation.

The frequency of an LC oscillator is governed by the equation:

$$F = \frac{1}{2\pi\sqrt{LC}} \quad (1)$$

where F=frequency, L=inductance, and C=capacitance. Thus, the frequency of the oscillator varies inversely as the square root of the product of L and C, and, as will be discussed below, this frequency can be made to vary in a given manner (i.e., linearly or logarithmically) by appropriately governing the way in which C varies, given a constant L.

It is to be noted that the absolute value of the maximum and minimum capacity that exists between track 14 and probe 16 will determine the frequency swing of oscillator 22. Generally, and as a starting point, the standard formula for calculating the capacity that exists between complementary sized parallel plates is $$C = (0.0885 \, k \, A)/d \quad (2)$$

where C=capacitance is picofarads, k=the dielectric constant of the material separating the plates, A=area of one plate in square centimeters, and d=distance between the plates in centimeters. However, the instant apparatus deals with the capacity between a knife-edge like probe and the immediately facing portion or linewidth of the track. Thus the area 'A' of the instant structure is a more complex function. But from formula (2) above, it can be seen that the absolute value of the capacity in the inventive device will depend on the size of the track immediately facing the edge of the probe, size of the probe, spacing between the edge of the probe and track, and dielectric constant of the material (usually air) separating the same. In the example that is discussed below, the value of maximum capacity is designed to pull the resonant frequency of crystal 22b and hence oscillator 22a to 20 MHz exactly, and the minimum value of this capacity is designed so that the crystal oscillates at 20,000,360 Hz. However, the precise frequency chosen for oscillator 22 and the fact that the same is crystal controlled is clearly a matter of design choice. The frequency of oscillator 22 and the range of frequency over which it is pulled need not be chosen as precisely as the values cited above. For given values of capacitance and hence the frequency swing of a given type of oscillator can be prorated along the region of angular interest, and weighted by microprocessor if the resulting change in frequency other than linear.

In use and operation, and as part 12 carrying with it capacitive track 14 moves angularly relative to pick-up probe 16, the capacity therebetween changes. This analog change in capacity is applied to and pulls the resonant frequency of crystal 22b effecting a corresponding analog shift or warping of the output frequency of oscillator 22a. This change in capacity causes the frequency of oscillator 22a to vary from 20,000,000 Hz to 20,000,360 Hz as the shaft makes one full rotation and the capacity between the track and probe varies from a corresponding maximum to a corresponding minimum. A signal lead 24 applies the output energy of oscillator 22 to an input of a mixer 26. A hetrodyne oscillator 28 that, in the example under discussion, is oscillating at an exact frequency of 20 MHz and is crystal controlled for stability, has its output applied along a signal lead 30 to another input of mixer 26. In mixer 26 the energy from oscillator 22, varying from 20,000,000 Hz to 20,000,360 Hz, is hetrodyned or beat against the 20 MHz energy from reference crystal oscillator 28 resulting in several mixer products one of which is a difference frequency that varies in frequency from 0 to 360 Hz. A signal lead 32 applies the output of mixer 26 to a low-pass filter 34. Filter 34 sharply attenuates all signals above 400 Hz resulting in a signal output from filter 34 whose frequency varies from 0 to 360 Hz and which is in analog correspondence with the relative angular rotation between the track and probe. A signal lead 36 couples the analog signal from filter 34 to a counter and display-driver 38. Counter-driver 38 counts and digitizes the analog input into a, say, seven segment format. A signal lead 40 then applies the encoded format to a digital readout 42 for display.

In the example above, assume that the type of capacitance change between track and probe effects a linear change in frequency, and assume that the relative angular rotation between track and probe results in a capacitance that pulls oscillator 22 onto a frequency of 20,000,120 Hz. This signal, when beat against the 20 MHz reference of oscillator 28 will produce a difference frequency of 120 Hz. The 120 Hz signal will be applied to counter-driver 38 for display as '120' and, as such, will be equal to 120 degrees of relative rotation between the track and probe.

The frequency of oscillator 22 is chosen so that the capacitive swing associated with the rotational sweep of track 14 relative to pick-up probe 16 produces a sufficiently large change in the frequency of oscillator 22 to correspond to a desired degree of precision. Generally, the higher the frequency, up to the point where the self-inductance and self-capacitance of the circuit elements themselves interfers with circuit operation, the greater will be the pulling effect on the oscillator exhibited by a given capacity between track and probe.

Figure 2B:
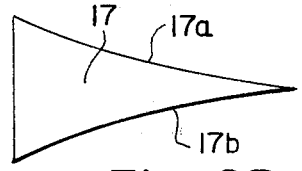
Figure 3:
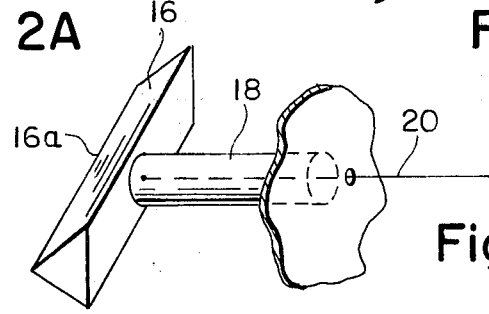
FIG. 3 is an enlarged perspective view of a capacitive pick-up probe.
Figure 4:
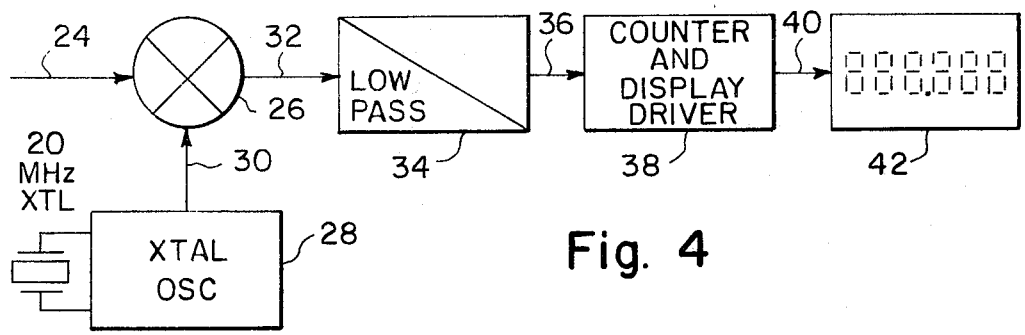
FIG. 4 is a block diagram showing the hetrodyning arrangement used to generate a resultant frequency.

Moreover, the geometric configuration given to the capacitive track will effect the type of frequency change produced in oscillator 22. Hence, since the isosceles triangle shown in FIG. 2A is formed of linear elements, this form of capacitive track will effect a linear change in capacity between itself and the probe as the track sweeps past the relatively maintained orientation of the probe. This linear change in capacity tends to produce a corresponding logarithmic change in the frequency of oscillator 24. In FIG. 2B another form of capacitive track, track 17 is shown. Track 17 is in a form that might be considered triangular, but its depending sides, sides 17a and 17b, exhibit a logarithmic taper. As track 17 moves angularly past the relatively maintained orientation of probe 16, it effects a corresponding logarithmic change in capacity that tends to produce a linear change in the frequency of oscillator 22. Indeed, the capacitive track can assume a variety of shapes. The critical fact governing the form of the track is that the relative angular rotation between the track and probe effect a geometric asymmetry therebetween which results in a unique value of capacitance for each given angular position thereof.

Turning now to FIGS. 5 and 6, there is shown another embodiment of the present invention. In this embodiment the inventive apparatus does not require an electrically grounded capacitive track or a common electrical connection between track and probe. In the apparatus shown, shaft 10 is formed with an enlarged electrically conductive cylindrical part 512 which is coaxially aligned on shaft 10 for concentric rotation therewith. A triangularly configured capacitive track, track 514, having a base 514a and an apex 514b, is either embossed on the peripheral surface of part 512 and thus projects minutely upwardly, plateau-like therefrom, as shown, or track 514 can be recessed or cut into the surface of part 512. As with track 14 mentioned earlier, track 514 is disposed on part 512 in such manner as to extend along the region of angular interest. In the example shown, this causes base 514a to meet apex 514b at an abrupt discontinuity of cross-section.

A capacitive pick-up probe 44 is comprised of dielectric material and is in the form of an elongate wedge or knife-like element 46 defined by two intersecting essentially planar surfaces, namely surface 46a and surface 46b. Element 46 has a longitudinal length at least as long or as wide as base 514a of track 514 and is defined by a sharp, substantially straight, longitudinal edge 46c formed along the line of intersection of surfaces 46a and 46b. A plurality of spaced parallel arrayed ground wires 48 are disposed on wedge 46 such that the wires run transversly across surface 46b in comb-like disposition thereon and bend sharply back upon themselves across edge 46c. Each wire 48 terminates on surface 46a a short distance from the last-mentioned edge, as shown. With this construction and when looking along the longitudinal axis of the probe, each ground wire 48 presents a sharp V-shaped tip or prong as it angles over edge 46c in pointed disposition thereon. Along the rearward surface of element 46, namely surface 46d, ground wires 48 are electrically joined to a common bus 50 that itself is electrically coupled to a ground lead 52.

A plurality of spaced, parallel arrayed sense wires 54 are disposed on element 46 interdigitated, so to speak, among ground wires 48 such that sense wires 54 run traversely across surface 46a, in comb-like disposition thereon and bend sharply back upon themselves across edge 46c in a reverse sense, as it were, when compared to ground wires 48. Each sense wire 54 terminates on surface 46b a short distance from edge 46c, as shown. On rear surface 46d of element 46, sense wires 54 are electrically joined to a common bus 56. With this construction, wires 48 and 54 present a capacitively balanced, parallel array of electrically alternate wires each of which run point-like across edge 46c.

A dielectric arm 18 supports pick-up probe 46. The arm positions the probe so that edge 46c points directly at and is minutely spaced from track 514, with the former held in broadside disposition with respect to the latter. With this construction, edge 46c of probe 44 is oriented parallel to base 514a of track 514. The spacing between track and probe is such as to establish a sensible interaction, discussed below, therebetween. One end of lead 20 is electrically coupled to sense bus 56. The other end of lead 20 is applied to oscillator 22, as noted above. For electrically stability, lead 20 is disposed through dielectric arm 18 and is immobilized thereby.

Use and operation of the embodiment of FIGS. 5 and 6 is somewhat similar to the use and operation of the earlier described embodiment. The basic difference is that as track 514 moves angularly relatively to pick-up probe 44, it disturbs the electrical (capacitive) balance thereof and effects an analog change in capacity between the point-like tips of the alternately arrayed sense and ground wires on edge 46c of probe 44. Or, stated differently, as the track and probe move angularly, one relatively to the other, the increasing or decreasing "width" of the track immediately facing the alternately arrayed sense and ground wires, or capacitive network on the probe, induces an analog change in capacity of the network in correspondence with such relative angular rotation. Lead 20 applies this analog change in capacity to oscillator 22 "warping" or pulling the frequency of same, as noted above, for processing and digital display of relative angular rotation between the track and probe.

In certain instances it might be desirable to increase the sensitivity of probe 44 to relative angular movements of the track. This can be done by increasing the density or numbers of alternately arrayed sense and ground wires, per linear centimeter, on the probe.

Turning now to FIG. 7 there is shown another embodiment of the present invention used to sense the relative angular rotation of shaft 10. An enlarged dielectric disc 58 is attached concentrically or coaxially to shaft 10 for rotation therewith. Disc 58 has a planar face 58a on which is placed an electrically grounded, metallic eliptical cam 60. Cam 60 can be of thin metallic foil-like construction or the cam can be vacuum disposited on face 58a. Cam 60 is defined by a center 60a concentric with shaft 10, and an eliptically running, spirally wound cam-defining edge 60b. Edge 60b coils radially outwardly from center 60b to a point on the circumference of disc 58. Put another way, edge 60b has a convoluted center-directed convergence that runs from the rim of disc 58 to cam center 60a. Cam 60 terminates abruptly along a radial line or given radial width 60c drawn from center 60a to the point where edge 60b meets the rim of disc 58. A capacitive pick-up probe 716 having an elongate edge 16a is closely spaced from cam 60. Probe 716 is in all respects similar to the construction of pick-up probe 16 discussed in the embodiment of FIGS. 1 through 4. A dielectric arm 18 supports probe 716 such that edge 16a thereof points directly at cam 60. The edge is held in broadside opposition to cam face 60 thus establishing a measureable capacity thereacross. The broadside width or longitudinal length of pick-up probe 716 and hence edge 16a thereof is at least as long as radial line 60c. As noticed, probe 716 is given a radial off-set or oriented along an imagined ray that runs from the center of the cam to the rim of disc 58, but is parallel spaced thereto. With this construction, and as shaft 10 and disc 58 rotate relatively to probe 716, a nearly logarithmic change in capacitance will be experienced between the cam and probe during use and the edge of the operation thereof as will be described now.

Use and operation of the embodiment of FIG. 7 should be nearly apparent. As shaft 10 revolves around its longitudinal axis, cam 60 revolves relative to pick-up probe 716. This causes eliptical edge 60b to sweep across the relatively maintained orientation of longitudinal edge 16a of probe 716. As this occurs, the capacity between cam 60 and pick-up probe 716 experiences an analog change which is proportional to the angular rotation of the former relatively to the latter. This analog change in capacity is applied to, say, an oscillator 22 by means of lead 20 for resolution into relative angular rotation, as noted above.

In the example under discussion, disc 58 is comprised of dielectric material and cam 60 shares a common electrical return with probe 716. It is not mandatory that this be the case, however. For using a probe constructed such as the one described with reference to FIGS. 5 and 6, the cam and probe would not require a common electrical return. With either type of probe, cam 60 can be machined or embossed on the longitudinal end of the shaft, or the cam can be recessed in this end.

Of course, by carrying forward the principles of the present invention it is possible to determine relative angular rotation by means of an induced change of inductance between two relatively rotating members. Hence, turning now to FIG. 8 there is shown another embodiment of the present invention using this inductive approach. In FIG. 8, a shaft or cylindrical member 62 is comprised of dielectric stock. An electrically shorted helical loop 64 is spirially wound on the longitudinal periphery of the shaft. More particularly, loop 64 makes one turn with its distal ends 64a and 64b separatingly terminated along a longitudinal or axial ray, so to speak, and shorted by an axially aligned shorting element 64c. A relatively stationary inductive pick-up coil or oscillator coil 66 is of elongate solenoidal configuration, preferably. The longitudinal axis of oscillator coil 66 is positioned off-set with respect to the central longitudinal axis of shaft 62 and coil 64, as shown. Preferably, coil 66 is wound with the same rotational sense or in the same direction as loop 64. Leads 66a of oscillator coil 66 are electrically coupled to and thus make coil 66 part of the frequency determining element of a self-excited, free-running LC oscillator, not shown.

The value of the inductance of coil 66, when in the proximity of loop 64, will depend on the coefficient of coupling and mutual inductance that exists between the two coils, in addition to the respective self-inductance of each coil. Generally, these terms are related by the standard formula:

$$K = \frac{m}{\sqrt{L_1 L_2}} \tag{3}$$

where K=coefficient of coupling, m=mutual inductance, and $L_1$ and $L_2$=respective self-inductance of each coil (expressed in the same units). From formula (1) above and given a constant capacitance 'C,' the frequency of the oscillator to which coil 66 is coupled will then vary in response to the change in inductance of coil 66 during use and operation of of the invention as will be described now.

In use and operation, and as shaft 62 revolves relatively around its longitudinal axis with respect to coil 66, the inductance of pick-up coil 66 is caused to fluctuate analogically owing to the change in the coefficient of coupling between it and the shorted loop. This analog change in the coefficient of coupling between pick-up coil 66 and loop 64 stems from the geometry of the elements. This geometry mandates that as loop 64 revolves about its longitudinal axis, the effective distance, 'd,' between a portion of loop 66 and coil 64 is caused to change in proportion to the angular rotation of the former relatively to the latter. Put differently and from an electrical standpoint, as shaft 62 revolves, a portion of loop 64 appears to move closer to or further from coil 66 effectively "modulating" the coefficient of coupling between the shorted loop and coil 66. This induces a change in the inductance of coil 66 thus pulling the frequency of the oscillator to which it is coupled. The change in oscillator frequency is, again, easily monitored and processed into angular rotation of shaft 62 relative to coil 66.

In the embodiment of FIGS. 1 through 7, it is to be understood that the capacitive pick-up probe can be placed on the relatively rotating shaft and that the capacitive track can be placed collar-like around and closely spaced from the periphery of the shaft. Within the confines of this disclosure this arrangement is merely a matter of design choice. Furthermore, capacitive pick-up probe 16 can assume many forms. The probe can be fabricated from a single piece of wire or the probe can be formed from flat stock and the like.

In certain instances, and now reference is made to FIG. 1, the pick-up probe and oscillator 22 can be embedded in a dielectric material such as a Lucite ® block 68. This would facilitate alignment of the pick-up probe and add to the overall stability of the system since only the DC leads and oscillator output lead would extend from the block. Indeed, the pick-up probe and oscillator 22 can be of integral design with lead 24 configured to act as a small antenna. With this construction, and if oscillator 22 were fabricated of CMOS transistors, the probe, oscillator, antenna, and a battery can be embedded in a dielectric block and assembled as a monolithic unit with no leads extending therefrom. The minute radiated RF energy from the embedded antenna can be detected by a small loop in close proximity thereto.

In environments where temperature extremes are encountered, or where a high degree of precision is desired, the thermal coefficient of expansion of the probe and track can be used to counteract the overall drift. Hence the probe can be made of metal that exhibits a negative coefficient of thermal expansion and the track can be made of a metal that exhibits a positive coefficient of thermal expansion.

Of course it will be apparent to those skilled in the art that the track and probe of the present invention are designed for operation in an isolated environment. Such isolation will prevent stray objects from affecting the capacitance that exists between the track and probe. Indeed, in some applications the track and probe can be placed in an air-tight enclosure with the same being evacuated, or filled with an inert gas. Then, too, it will be apparant that during operation of the invention the distance between track and probe must remain constant or fixed. Any eccentricities on the track surface will tend to effect a capacitance change and this change will degrade system performance. Attention to these factors will tend to minimize such unwanted proximity effects.

The principles of the present invention, using either the light interrogation of the above-mentioned copending application or the capacitive or inductive approach of the instant disclosure, can be extended to a linear transducer and used to measure linear displacement between two relatively moveable members. In such a light interrogated linear transducer, the optical track of the aforesaid co-pending application can be laid-out or extended linearly and adapted to move with one of the relatively linearly moving members. As the track moved relatively to the maintained orientation of the line-pattern, the track and line-pattern would interact in a way that causes the amount of light which is sent to the detector to exhibit analog correspondence with such relative linear motion. And, in the same manner, if the capacitive (or inductive) track were extended linearly and adapted to move with the relatively linearly moving member, the relatively linear motion between the track and probe would result in a capacitance (or inductance) therebetween that would analogically correspond with such relative linear motion.

While only a few embodiments of the present invention have been shown and described, it is to be understood that many changes and modifications can be made hereto without departing from the spirit and scope hereof.

What is claimed is:

1. For use with an angle-position sensor wherein the sensor employs a capacitive track which is disposed along the region of angular interest, an elongate capacitive pick-up probe disposed in broadside opposition to said track and closely spaced therefrom, means on said probe establishing a capacitive network thereon the capacitance of which is adapted to change in accordance with relative angular displacement between said probe and track whereby as the latter moves angularly relatively to former, the capacitance of said network changes in analog correspondence therewith.

2. Apparatus for detecting angular rotation comprising a capacitive track coextensive with the region of angular interest, a capacitive pick-up probe spaced from said track, said pick-up probe having a substantially sharp elongate edge which is positioned with respect to said track whereby the former and latter establish a measurable capacity therebetween, the angular displacement to be measured being determined by the relative angular rotation between said track and edge such that as the one move relatively angularly with respect to the other, a geometric asymmetry is produced between said edge and track which causes the capacity that exists thereacross to change unambiguously and in analog correspondence with said relative angular rotation, and means coupled to said capacity for responding thereto and producing an output proportional therewith.

3. An angle-position sensor comprising a capacitive pick-up probe having a substantially sharp elongate edge, a capacitive track closely spaced from said edge and disposed along the region of angular interest, said edge being positioned with respect to said capacitive track so as to establish a measurable capacity therebetween, said capacitive track being configured as an eliptical cam having a center and a cam-defining edge that coils radially outwardly from said center along an eliptical path terminating in a given radial width, said edge having a longitudinal length that is substantially complementary to said radial width and being given a radial off-set which positions said edge along an imagined ray from said center and substantially parallel thereto, said edge being oriented broadside to said cam with the angular displacement to be measured being defined by relative angular rotation between said edge and cam whereby as the former revolves relatively to the latter, a geometric asymmetry is produced therebetween effecting an analong change in the capacity that exists thereacross which is proportional to the relative angular rotation.

4. An angle-position transducer comprising a capacitive track disposed along the region of angular interest, a capacitive pick-up probe, said pick-up probe being defined by a sharp elongate edge that is disposed in parallel broadside opposition to said capacitive track and closely spaced therefrom thus establishing electrical capacity therebetween, the angular displacement to be measured being determined by relative angular movement between said capacitive track and edge, means for generating electromagnetic energy, said capacity adapted to control the frequency of the electromagnetic energy such that as said capacitive track moves relatively angularly with respect to said edge, said capacity changes unambiguously and in correspondence therewith whereby the frequency of said electromagnetic energy responds thereto in a manner that exhibits analog correspondence with said relative angular movement.

5. The angle-position transducer of claim 4, said means for generating electromagnetic energy comprising an oscillator.

6. The angle-position transducer of claim 5, a hetrodyne oscillator and a mixer, the respective outputs of said oscillator and hetrodyne oscillator being applied to said mixer whereby the resultant output thereof is shifted in frequency in analog correspondence with said relative angular movement.

7. An angle-position transducer including a capacitive track disposed along the region of angular interest, a capacitive pick-up probe having a substantially sharp elongate edge spaced from and in close proximity to said capacitive track thus establishing a measurable capacity thereacross, the angular displacement to be measured being determined by relative angular movement between said capacitive track and edge whereby as said capacitive track moves relatively angularly with respect to said edge, a geometric asymmetry is produced therebetween causing the capacity that exists thereacross to change unambiguously and in a manner that exhibits correspondence with the relative angular displacement.

8. The angle-position transducer of claim 1, said pick-up probe being stationary and maintaining a fixed orientation relative to said capacitive track.

9. The angle-position transducer of claim 1, said capacitive track being stationary and maintaining a fixed orientation relative to said pick-up probe.

10. An angle-position transducer comprising a capacitive track in the form of a continuous single geometric figure disposed along the region of angular interest, an elongate capacitive pick-up probe, said pick-up probe being defined by a substantially sharp elongate edge that is closely spaced from said capacitive track and disposed broadside thereto thereby establishing a sensible capacity therebetween, the angular displacement to be measured being defined by the relative rotation between said capacitive track and edge whereby as the former revolves relatively to the latter, the capacity that exists therebetween changes analogically and in a way that exhibits correspondence with such relative rotation.

11. The angle-position transducer of claim 10, said capacitive track being comprised of conductive material.

12. The angle-position transducer of claim 11, said capacitive track being of triangular configuration.

13. The angle-position transducer of claim 12, said capacitive track being in the form of an isosceles triangle.

14. The angle-position transducer of claim 13, said edge of said pick-up probe having a broadside or longitudinal length at least as long as the base of said isosceles triangle and orientated parallel thereto.

15. The angle-position transducer of claim 11, said pick-up probe being of elongate wedgelike configuration thus tapering to a longitudinal knife edge that defines said edge of said pick-up probe.

16. The angle-position transducer of claim 10, said pick-up probe being in the form of an elongate piece of small diameter wire.

17. The angle-position transducer of claim 15, a plurality of spaced wires placed on said knife edge in transverse, parallel comb-like disposition thereon, each of said wires being bent point-like across said knife edge with alternate ones of said wires being joined electrically and thereby form a capacitively balanced network thereon.

18. The angle-position transducer of claim 11, said capacitive track being generally of triangular configuration and simulative of an isosceles triangle, the depending arms of said configuration that meet at the vertex being given complementary logarithmic tapers.

* * * * *